(12) United States Patent
Ghenciu et al.

(10) Patent No.: US 8,586,424 B2
(45) Date of Patent: **\*Nov. 19, 2013**

(54) SWITCHING MATERIALS COMPRISING MIXED NANOSCOPIC PARTICLES AND CARBON NANOTUBES AND METHOD OF MAKING AND USING THE SAME

(75) Inventors: Eliodor G. Ghenciu, King Of Prussia, PA (US); Thomas Rueckes, Rockport, MA (US); Thierry Yao, Lake Oswego, OR (US); Thomas Kocab, Johnston, RI (US)

(73) Assignee: Nantero Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/074,792

(22) Filed: Mar. 29, 2011

(65) Prior Publication Data

US 2011/0183489 A1 Jul. 28, 2011

Related U.S. Application Data

(62) Division of application No. 12/274,033, filed on Nov. 19, 2008, now Pat. No. 7,915,637.

(51) Int. Cl.
*H01L 21/332* (2006.01)
(52) U.S. Cl.
USPC .......................................... 438/139; 257/109
(58) Field of Classification Search
USPC ........................................ 257/109; 438/139
See application file for complete search history.

(56) References Cited

U.S. PATENT DOCUMENTS

| | | | |
|---|---|---|---|
| 6,057,637 A | 5/2000 | Zettl |
| 6,128,214 A | 10/2000 | Kuekes et al. |
| 6,256,767 B1 | 7/2001 | Kuekes et al. |
| 6,277,318 B1 | 8/2001 | Bower |
| 6,314,019 B1 | 11/2001 | Kuekes et al. |
| 6,342,276 B1 | 1/2002 | You |
| 6,409,567 B1 | 6/2002 | Amey, Jr. et al. |
| 6,422,450 B1 | 7/2002 | Zhou et al. |
| 6,423,583 B1 | 7/2002 | Avouris et al. |

(Continued)

FOREIGN PATENT DOCUMENTS

| | | |
|---|---|---|
| GB | 2364933 | 2/2002 |
| JP | 11008690 | 1/1999 |

(Continued)

OTHER PUBLICATIONS

International Search Authority, International Search Report for PCT/US2005/045316 mailed Sep. 6, 2006, 2 pages.

(Continued)

*Primary Examiner* — Jarrett Stark
*Assistant Examiner* — Nicholas Tobergte
(74) *Attorney, Agent, or Firm* — Nantero Inc.

(57) ABSTRACT

An improved switching material for forming a composite article over a substrate is disclosed. A first volume of nanotubes is combined with a second volume of nanoscopic particles in a predefined ration relative to the first volume of nanotubes to form a mixture. This mixture can then be deposited over a substrate as a relatively thick composite article via a spin coating process. The composite article may possess improved switching properties over that of a nanotube-only switching article. A method for forming substantially uniform nanoscopic particles of carbon, which contains one or more allotropes of carbon, is also disclosed.

20 Claims, 7 Drawing Sheets

(56) References Cited

U.S. PATENT DOCUMENTS

| | | |
|---|---|---|
| 6,445,006 B1 | 9/2002 | Brandes et al. |
| 6,495,116 B1 | 12/2002 | Herman |
| 6,495,258 B1 | 12/2002 | Chen et al. |
| 6,515,339 B2 | 2/2003 | Shin et al. |
| 6,528,020 B1 | 3/2003 | Dai et al. |
| 6,548,841 B2 | 4/2003 | Frazier et al. |
| 6,630,772 B1 | 10/2003 | Bower et al. |
| 6,645,628 B1 | 11/2003 | Shiffler, Jr. et al. |
| 6,706,402 B2 | 3/2004 | Rueckes et al. |
| 6,707,098 B2 | 3/2004 | Hofmann et al. |
| 6,759,693 B2 | 7/2004 | Vogeli et al. |
| 6,803,840 B2 | 10/2004 | Hunt et al. |
| 6,808,746 B1 | 10/2004 | Dai et al. |
| 6,809,465 B2 | 10/2004 | Jin |
| 6,833,558 B2 | 12/2004 | Lee et al. |
| 6,858,197 B1 | 2/2005 | Delzeit |
| 6,863,942 B2 | 3/2005 | Ren et al. |
| 6,881,977 B1 * | 4/2005 | Lin .................. 257/79 |
| 6,888,773 B2 | 5/2005 | Morimoto |
| 6,890,780 B2 | 5/2005 | Lee |
| 6,894,359 B2 | 5/2005 | Bradley et al. |
| 6,899,945 B2 | 5/2005 | Smalley et al. |
| 6,905,892 B2 | 6/2005 | Esmark |
| 6,918,284 B2 | 7/2005 | Snow et al. |
| 6,919,592 B2 | 7/2005 | Segal et al. |
| 6,919,740 B2 | 7/2005 | Snider |
| 6,921,575 B2 | 7/2005 | Horiuchi et al. |
| 6,924,538 B2 | 8/2005 | Jaiprakash et al. |
| 6,946,410 B2 | 9/2005 | French et al. |
| 6,990,009 B2 | 1/2006 | Bertin et al. |
| 7,015,500 B2 | 3/2006 | Choi et al. |
| 7,057,402 B2 | 6/2006 | Cole et al. |
| 7,097,906 B2 | 8/2006 | Gardner |
| 7,115,901 B2 | 10/2006 | Bertin et al. |
| 7,115,960 B2 | 10/2006 | Bertin et al. |
| 7,161,403 B2 | 1/2007 | Bertin et al. |
| 7,335,395 B2 | 2/2008 | Ward et al. |
| 7,375,369 B2 | 5/2008 | Sen et al. |
| 7,667,999 B2 | 2/2010 | Herner et al. |
| 7,915,637 B2 | 3/2011 | Ghenciu et al. |
| 7,982,209 B2 | 7/2011 | Herner et al. |
| 2001/0004979 A1 | 6/2001 | Han et al. |
| 2001/0023986 A1 | 9/2001 | Mancevski |
| 2002/0160111 A1 | 10/2002 | Sun et al. |
| 2002/0175390 A1 | 11/2002 | Goldstein et al. |
| 2003/0004058 A1 | 1/2003 | Li et al. |
| 2003/0122111 A1 | 7/2003 | Glatkowski |
| 2003/0177450 A1 | 9/2003 | Nugent |
| 2003/0180472 A1 * | 9/2003 | Zhou et al. .............. 427/430.1 |
| 2003/0200521 A1 | 10/2003 | DeHon et al. |
| 2004/0005723 A1 | 1/2004 | Empedocles et al. |
| 2004/0007528 A1 | 1/2004 | Bakajin et al. |
| 2004/0023253 A1 | 2/2004 | Kunwar et al. |
| 2004/0031975 A1 | 2/2004 | Kern et al. |
| 2004/0041154 A1 | 3/2004 | Watanabe et al. |
| 2004/0043527 A1 | 3/2004 | Bradley et al. |
| 2004/0071949 A1 | 4/2004 | Glatkowski et al. |
| 2004/0099438 A1 | 5/2004 | Arthur et al. |
| 2004/0104129 A1 | 6/2004 | Gu et al. |
| 2004/0132070 A1 | 7/2004 | Star et al. |
| 2004/0181630 A1 | 9/2004 | Jaiprakash et al. |
| 2004/0238887 A1 | 12/2004 | Nihey et al. |
| 2004/0253167 A1 | 12/2004 | Silva et al. |
| 2004/0265550 A1 | 12/2004 | Glatkowski et al. |
| 2004/0266106 A1 | 12/2004 | Lee |
| 2005/0053525 A1 | 3/2005 | Segal et al. |
| 2005/0056877 A1 | 3/2005 | Rueckes et al. |
| 2005/0079659 A1 | 4/2005 | Duan et al. |
| 2005/0095938 A1 | 5/2005 | Rosenberger et al. |
| 2005/0212014 A1 | 9/2005 | Horibe et al. |
| 2005/0247671 A1 * | 11/2005 | Yaniv et al. ............. 216/67 |
| 2006/0237537 A1 | 10/2006 | Empedocles |
| 2006/0250843 A1 | 11/2006 | Bertin et al. |
| 2006/0250856 A1 | 11/2006 | Bertin et al. |
| 2006/0258122 A1 | 11/2006 | Whitefield et al. |
| 2006/0264053 A1 | 11/2006 | Yates |
| 2006/0281256 A1 | 12/2006 | Carter et al. |
| 2006/0281287 A1 | 12/2006 | Yates et al. |
| 2006/0292716 A1 | 12/2006 | Gu et al. |
| 2007/0004191 A1 | 1/2007 | Gu et al. |
| 2009/0166609 A1 | 7/2009 | Schricker et al. |
| 2009/0166610 A1 | 7/2009 | Schricker et al. |
| 2009/0168491 A1 | 7/2009 | Schricker et al. |
| 2009/0194839 A1 | 8/2009 | Bertin et al. |

FOREIGN PATENT DOCUMENTS

| | | |
|---|---|---|
| JP | 11210336 | 7/1999 |
| JP | 2002258885 | 4/2002 |
| WO | WO-98/39250 | 9/1998 |
| WO | WO-99/65821 | 12/1999 |
| WO | WO-00/48195 | 8/2000 |
| WO | WO-01/03208 | 1/2001 |
| WO | WO-02/45113 | 6/2002 |
| WO | WO-02/48701 | 6/2002 |
| WO | WO-03/016901 | 2/2003 |
| WO | WO-03/034142 | 4/2003 |
| WO | WO-2005/019793 | 3/2005 |
| WO | WO-2005/031299 | 4/2005 |
| WO | WO-2008/021900 | 2/2008 |
| WO | WO-2010/059152 | 5/2010 |

OTHER PUBLICATIONS

International Search Report and Written Opinion for International Patent Application PCT/US05/18467, mailed Oct. 1, 2007, 5 pages.

International Search Report, International Searching Authority, for International Application PCT/US05/18539, mailed Sep. 18, 2006, 4 pages.

Valentini, L. et al., "Sensors for Sub-ppm $NO_2$ Gas Detection Based on Carbon Nanotube Thin Films," *Applied Physics Letters*, 2003, vol. 82(6), pp. 961-963.

Ago, et al., "Workfunction of Purified and Oxidized Carbon Nanotubes," Synthetic Metals, vol. 103, 1999, pp. 2494-2495.

Ajayan, et al., "Applications of Carbon Nanotubes," Topics Appl. Phys., vol. 80, 2001, pp. 391-425.

Amblard, G., "Development and characterization of carbon nanotube processes for NRAM technology," Proc. of SPIE, 2011, vol. 7970, pp. 797017-1-797017-7.

Avouris, P., "Carbon nanotube electronics," Chemical Physics (Itol), vol. 281, 2002, pp. 429-445.

Awano, Y., "Graphene for VLSI: FET and Interconnect Applications," IEDM 2009 Technical Digest, pp. 10.1.1-10.1.4.

Banerjee, et al., "Functionalization of Carbon Nanotubes with a Metal-Containing Molecular Complex," Nano Letters, vol. 2, No. 1, 2002, pp. 49-53.

Bachtold, et al., "Logic Circuits Based on Carbon Nanotubes," Physica E 16, 2003, pp. 42-26.

Berhan, et al., "Mechanical Properties of Nanotube Sheets: Alterations in Joint Morphology and Achievable Moduli in Manufacturable Materials," J. Appl. Phys., vol. 95, No. 8, Apr. 2004, pp. 4335-4345.

Bonard, et al., "Monodisperse Multiwall Carbon Nanotubes Obtained with Ferritin as Catalyst," Nano Letters, vol. 2, No. 6, 2002, pp. 665-667.

Brock, et al., "Carbon Nanotube Memories and Fabrics in a Radiation Hard Semiconductor Foundry," 2005 IEEE Conf., 9 pgs.

Brown, K. M., "System in package "The Rebirth of SIP"," 2004 IEEE Custom Integrated Circuits, May 2004, 6 pages.

Cassell, et al., "Large Scale CVD Synthesis of Single-Walled Carbon Nanotubes," J. Phys. Chem. B, vol. 103, 1999, pp. 6484-6492.

Chen, et al., "Heterogeneous Single-Walled Carbon Nanotube Catalyst Discovery and Optimization," Chem. Mater., vol. 14, 2002, pp. 1891-1896.

Chen, et al., "Self-Aligned Carbon Nanotube Transistors with Charge Transfer Doping," Applied Phys. Ltrs., No. 86, 2005, pp. 123108-1-123108-3.

Chen, et al., "Self-Aligned Carbon Nanotube Transistors with Novel Chemical Doping," IEDM 04:695,698, 2004.

(56) References Cited

OTHER PUBLICATIONS

Cheng, H.M., "Large-Scale and Low-Cost Synthesis of Single-Walled Carbon Nanotubes by the Catalytic Pyrolysis of Hydrocarbons," Appl. Phys. Ltrs., vol. 72, No. 25, Jun. 1998, pp. 3282-3284.
Chiang, et al., "Purification and Characterization of Single-Wall Carbon Nanotubes (SWNTs) Obtained from the Gas-Phase Decomposition of CO (HiPco Process)," J. Phys. Chem. B, vol. 105, 2001, pp. 1157-1161.
Collins, et al., "Engineering Carbon Nanotubes and Nanotube Circuits Using Electrical Breakdown," Science, vol. 292, Apr. 27, 2001, pp. 706-709.
Crowley, et al., "512 Mb PROM with 8 layers of antifuse/Diode cells," IEEE International Solid-State Circuits Conference, vol. XLVI, Feb. 2003, pp. 284-285.
Cui, et al., "Carbon Nanotube Memory Devices of High Charge," Applied Phys. Ltrs., vol. 81, No. 17, Oct. 2002, pp. 3260-3262.
Dai, et al., "Controlled Chemical Routes to Nanotube Architectures, Physics, and Devices," J. Phys. Chem. B, vol. 103, 1999, pp. 11246-11255.
Delzeit, et al., "Multilayered Metal Catalysts for Controlling the Density of Single-Walled Carbon Nanotube Growth," Chem. Phys. Ltrs., vol. 348, 2001, pp. 368-374.
Derycke, et al., "Carbon Nanotube Inter- and Intramolecular Logic Gates," Nano Letters, vol. 1, No. 9, Sep. 2001, pp. 453-456.
Derycke, et al., "Controlling Doping and Carrier Injection in Carbon Nanotube Transistors," App. Phys. Ltrs., vol. 80, No. 15, Apr. 15, 2002, pp. 2773-2775.
Desai, et al., "Freestanding Carbon Nanotube Specimen Fabrication," Proceeding 2005 5th IEEE Conference on Nanotechnology, Nagoya, Japan, Jul. 2005.
Duan, et al., "Nonvolatile Memory and Programmable Logic from Molecule-Gated Nanowires," Nano Letters, XXXX, vol. 0, No. 0, A-D, 2002, 4 pgs.
Engel, et al., "Thin Film Nanotube Transistors based on Self-Assembled, Aligned, Semiconducting Carbon Nanotube Arrays," ACS Nano, 2008, vol. 2, No. 12, pp. 2445-2452.
Franklin, et al., "An Enhanced CVD Approach to Extensive Nanotube Networks with Directionality," Adv. Mater., vol. 12, No. 12, 2000, pp. 890-894.
Fuhrer, et al., "High-Mobility Nanotube Transistor Memory," Nano Letters, vol. 2, No. 7, 2002, pp. 755-759.
Haddon, et al., "Purification and Separation of Carbon Nanotubes," MRS Bulletin, Apr. 2004, pp. 252-259 (www.mrs.org/publicatons/bulletins).
Hafner, et al., "Catalytic Growth of Single-Wall Carbon Nanotubes from Metal Particles," Chem. Phys. Ltrs., vol. 296, 1998, pp. 195-202.
Heinz, et al., "Carbon Nanotubes as Schottky Barrier Transistors," Phys. Rev. Ltrs., vol. 89, No. 10, Sep. 2002, pp. 106801-1-106801-4.
Homma, et al., "Single-Walled Carbon Nanotube Growth on Silicon Substrates Using Nanoparticle Catalysts," JPN, J. Appl. Phys., vol. 41, 2002, pp. L89-L91.
Hone, J. "Phonons and Thermal Properties of Carbon Nanotubes," Topics Appl. Phys., 2001, pp. 273-286.
Huai, Y., "Spin-Transfet Torque MRAM (STT-MTAM): Challenges and Prospects," AAPS Bulletin, vol. 18, No. 6, Dec. 2008, pp. 33-40.
Huang, et al., "Logic Gates and Computation from Assembled Nanowire Building Blocks," Science, vol. 294, Nov. 2001, pp. 1313-1317.
Javey, "Carbon Nanotube Transistor Arrays for Multistage Complementary Logic and Ring Oscillators," Nano Letters, XXXX, vol. 0, No. 0, A-D, 2002, 4 pgs.
Javey, et al., "High-κ Dielectrics for Advanced Carbon Nanotube Transistors and Logic Gates," Nature Materials, vol. 1, 2002, pp. 241-246.
Javey, et al., "Carbon Nanotube Field-Effect Transistors with Integrated Ohmic Contacts and High-κ Dielectrics," Nano Letters, vol. 4, No. 3, 2004, pp. 447-450.

Jeong, et al., "A Purification Method of Single-Wall Carbon Nanotubes Using H2S and 02 Mixture Gas," Chem. Phys. Ltrs., vol. 344, Aug. 2001, pp. 18-22.
Jiang, et al., "Performance Breakthrough in 8nm Gate-All-Around Length Gate-All Around Nanowire Transistors using Metallic Nanowire Contacts," 2008 Symposium on VLSI Technology Digest of Technical Papers, pp. 34-35.
Johnson, R. C., "IBM fellow unrolls blueprint for nano," EE Times, Mar. 2006, 3 pgs. [http://www.eetimes.co/show/Article.jhtml?, Article ID=181500304].
Joselevich, et al., "Vectorial Growth of Metallic and Semiconducting Single-Wall Carbon Nanotubes," Nano Letters, vol. 0, No. 0, A-E, 2002.
Khan, et al., "Solubilization of Oxidized Single-Walled Carbon Nanotube in Organic and Aqueous Solvents through Organic Derivatization," Nano Letters, vol. 2, No. 11, 2002, pp. 1215-1218.
Kianian, et al., "A 3D Stackable Carbon Nanotube-based Nonvolatile Memory (NRAM)," ESSDERc, Nantero, Inc., Jun. 14, 2010, 4 pages.
Kong, et al., "Chemical Vapor Deposition of Methane for Single-Walled Carbon Nanotubes," Chem. Phys. Ltrs., vol. 292, Aug. 1998, pp. 567-574.
Kong, et al., "Nanotube Molecular Wires as Chemical Sensors," Science, vol. 287, Jan. 2000, pp. 622-625.
Kong, et al., "Quantum Interference and Ballistic Transmission in Nanotube Electron Wavegrindes," The American Physical Society, vol. 87, No. 10, Sep. 2001, pp. 106801-1-106801-4.
Langer, et al., "Electrical resistance of a carbon nanotube bundle," J. Mater. Res., vol. 9, No. 4, Apr. 1994, pp. 927-932.
Li, et al., "Carbon Nanotube Nanoelectrode Array for Ultrasensitive DNA Detection," Nano Letters, vol. 3, No. 5, 2003, pp. 597-602.
Li, et al., "Growth of Single-Walled Carbon Nanotubes from Discrete Catalytic Nanoparticles of Various Sizes," J. Phys. Chem. B, vol. 105, 2001, pp. 11424-11431.
Li, et al., "Preparation of Monodispersed Fe—Mo Nanoparticles as the Catalyst for CVD Synthesis of Carbon Nanotubes," Chem. Mater., vol. 13, 2001, pp. 1008-1014.
Lin, et al., "Novel Carbon Nanotube FET Design with Tunable Polarity," IEDM 04-687, 2004, pp. 29.2.1-29.2.4.
Martel, et al., "Carbon Nanotube Field-Effect Transistors and Logic Circuits," DAC 2002, Jun. 10-14, 2002, New Orleans, Louisiana, 5 pgs.
Nerushev, et al., "Carbon Nanotube Films Obtained by Thermal Chemical Vapour Deposition," J. Mater. Chem., vol. 11, 2001, pp. 1122-1132.
Novak, et al., "Nerve Agent Detection using Networks of Single-Walled Carbon Nanotubes," App. Phys. Ltrs., vol. 83, No. 19, Nov. 2003, pp. 4026-4028.
Niu, et al., "High Power Electrochemical Capacitors Based on Carbon Nanotube Electrodes," Appl. Phys. Ltrs., vol. 70, No. 11, Mar. 1997, pp. 1480-1482.
Novak, et al., "Nerve Agent Using Networks of Single-Walled Carbon Nanotubes," Appl. Phys. Ltr, vol. 83, No. 19, Nov. 2003, pp. 4026-4028.
Onoa, et al., "Bulk Production of Singly Dispersed Carbon Nanotubes with Prescribed Lengths," Nanotechnology, vol. 16, 2005, pp. 2799-2803.
Parikh, et al., "Flexible Vapour Sensors Using Single Walled Carbon Nanotubes," Sensors and Actuators B, vol. 113, 2006, pp. 55-63.
Peigney, et al., "A Study of the Formation of Single- and Double-Walled Carbon Nanotubes by a CVD Method," J. Phys. Chem. B, vol. 105, 2001, pp. 9699-9710.
Qi, et al., "Toward Large Arrays of Multiplex Functionalized Carbon Nanotube Sensors for Highly Sensitive and Selective Molecular Detection," Nano Letters, vol. 3, No. 3, 2003, pp. 347-351.
Radosavijevic, et al., "Nonvolatile Molecular Memory Elements Based on Ambipolar Nanotube Field Effect Transistors," Nano Letters, vol. 2, No. 7, 2002, pp. 761-764.
Rosendale, et al., "A 4 Megabit Carbon Nanotube-based Nonvolatile Memory (NRAAM)," ESSCIRC 2010 Proceedings, pp. 478-481.
Rueckes, et al., "Carbon Nanotube-Based Nonvolatile Random Access Memory for Molecular Computing," Science, vol. 289.
Servalli, G., "A 45nm Generation Phase Change Memory Technology," IEDM 2009 Technical Digest, pp. 5.7.1-5.7.4.

(56) References Cited

OTHER PUBLICATIONS

Shelimov, et al., "Purification of Single-Wall Carbon Nanotubes by Electronically Assisted Filtration," Chem. Phys. Ltrs., vol. 282, 1998, pp. 429-434.

Snow, et al., "Random Networks of Carbon Nanotubes as an Electronic Material," App. Phys. Ltrs., vol. 82, No. 13, Mar. 2003, pp. 2145-2147.

Sotiropoulou, et al., "Carbon Nanotube Array-Based Biosensor," Anal Bioanal Chem, vol. 375, 2003, pp. 103-105.

Star, et al., "Nanoelectronic Carbon Dioxide Sensors," Adv. Mater., vol. 16, No. 22, 2004, pp. 2049-2052.

Star, et al., "Nanotube Optoelectronic Memory Devices," Nano Letters, vol. 4, No. 9, 2004, pp. 1587-1591.

Ward, et al., "A Non-Volatile Nanoelectromechanical Memory Element Utilizing a Fabric of Carbon Nanotubes," IEEE 2004, pp. 34-38.

Wind, et al., "Fabrication and Electrical Characterization of Top Gate Single-Wall Carbon Nanotube Field-Effect Transistors," IBM T. J. Watson Research Ctr., 6A:1-9 plus figures 1-5, May 2002.

Wind, et al., "Vertical Scaling of Carbon Nanotube Field Effect Transistors Using Top Gate Electrodes," App. Phys. Ltrs., vol. 80, No. 20, May 2002, pp. 3817-3819.

Zhang, et al., "Metal Coating on Suspended Carbon Nanotubes and its Implications to Metal-tube Interaction," Chem. Phys. Ltrs., vol. 331, 2000, pp. 35-41.

Zhang, et al., "Select Pathways to Carbon Nanotube Film Growth," Adv. Mater., vol. 13, No. 23, Dec. 2001, pp. 1767-1770.

Zhang, et al., "Formation of Metal Nanowires on Suspended Single-Walled Carbon Nanotubes," Appl. Phys. Ltrs., vol. 77, No. 19, Nov. 2000, pp. 3015-3017.

Zhao, et al., "Frequency-Dependent Electrical Transport in Carbon Nanotubes," Phys. Review B, vol. 64, 2001, pp. 201402-1-201402-4.

Zhou, et al., "p-Channel, n-Channel Thin Film Transistors and p-n Diodes Based on Single Wall Carbon Nanotube Networks," Nano Letters, vol. 4, No. 10, 2004, pp. 2031-2035.

\* cited by examiner

|  | RESET of typical nanotube fabric layer | SET of typical nanotube fabric layer |
|---|---|---|
| Pulse Voltage | ~4.0 V | ~5.0 V |
| Rise/Fall Duration of Pulses | ~1.8 ns | ~1 µs |
| Pulse Width | ~50 ns | ~50 µs |
| Current After Function | Current after RESET is less than ~100 nA | Current after SET is more than ~1 µA. |

FIG. 7

SWITCHING MATERIALS COMPRISING MIXED NANOSCOPIC PARTICLES AND CARBON NANOTUBES AND METHOD OF MAKING AND USING THE SAME

PRIORITY CLAIM

This application is a divisional of and claims benefit under 35 U.S.C. §121 of U.S. patent application Ser. No. 12/274,033, entitled "SWITCHING MATERIALS COMPRISING MIXED NANOSCOPIC PARTICLES AND CARBON NANOTUBES AND METHOD OF MAKING AND USING THE SAME," filed Nov. 19, 2008, and is hereby incorporated by reference herein in its entirety.

CROSS-REFERENCE TO RELATED APPLICATIONS

This application is related to "Nonvolatile Nanotube Diodes and Nonvolatile Nanotube Blocks and Systems Using Same and Methods of Making Same," (U.S. patent application Ser. No. 12/273,807), which is incorporated by reference herein in its entirety.

TECHNICAL FIELD

The present invention relates to a spin-coatable material and a method for manufacturing the same for use in the preparation of composite articles and films. More particular, the present invention relates to such a material comprising a first volume of carbon nanotubes and a second volume of nanoscopic particles.

BACKGROUND

Any discussion of the related art throughout this specification should in no way be considered as an admission that such art is widely known or forms part of the common general knowledge in the field.

Nanotube fabric layers (or films) are used within a plurality of semiconductor devices. For example, U.S. patent application Ser. No. 11/835,856 to Bertin et al. teaches methods of using nanotube fabric layers to realize nonvolatile devices such as, but not limited to, block switches, programmable resistive materials, and programmable logic devices.

As described by Bertin et al., a volume of nanotube fabric can be placed into at least two nonvolatile resistive states by passing electric currents through said fabric. These nonvolatile resistive states can be used to create, for example, but not limited to, switch elements which behave as nonvolatile memory cells (wherein, typically, two nominal resistive states are used), nonvolatile variable resistor dividers for precision voltage supplies (wherein, typically, a pair of nanotube devices, each with a plurality of nominal nonvolatile resistive states, are used), and nonvolatile programmable logic devices (wherein, typically, multiple nonvolatile nanotube switch elements are used).

U.S. Pat. No. 7,335,395 to Ward et al. describes methods of applying a nanotube fabric layer on a substrate. Said methods include spin coating (wherein a solution of nanotubes is deposited on a substrate which is then spun to evenly distribute said solution across the surface of said substrate), spray coating (wherein a plurality of nanotube are suspended within an aerosol solution which is then disbursed over a substrate), and in situ growth of nanotube fabric (wherein a thin catalyst layer is first deposited over a substrate and then used to form nanotubes). Further, U.S. Pat. No. 7,375,369 to Sen et al. teaches a nanotube solution which is well suited for forming a nanotube fabric layer over a substrate layer via a spin coating process.

Studies for improved nanotube fabric layer and methods for forming the same are continuing.

SUMMARY OF THE DISCLOSURE

As such, there exists a need for an improved nanotube fabric layer over a substrate and method for manufacturing same. It would be advantageous if said method provided a manner of control over the volume density of nanotubes within said nanotube fabric layer. It would also be advantageous if said method enabled formation of a nanotube fabric layer of significant thickness within a minimum number of spin coat processes, and preferably within a single spin coat process.

The invention provides an improved nanotube fabric layer over a substrate and a method for manufacturing the same.

In particular, the present invention provides a nanotube device comprising a first electrode, a second electrode, and a composite article deposed between said first electrode and said second electrode. The composite article includes a first volume of nanotubes and a second volume of nanoscopic particles in a predefined ratio relative to the first volume of nanotubes.

The nanotube block switch of the present invention is formed over a substrate by first combining a first volume of nanotubes with a second volume of nanoscopic particles in a predefined ratio relative to the first volume of nanotubes to form a mixture material, and thereafter depositing said mixture material over said substrate via a spin coat process. In certain embodiments, the mixture can be homogeneous. In some other embodiments, the mixture can be heterogeneous.

The present invention also provides a method of forming substantially uniform nanoscopic particles of amorphous carbon from a volume of carbon black material. Said method entails reacting, in a first processing step, said volume of carbon black material with an oxidizing agent to form a carbon slurry. Thereafter, in a second processing step, said method entails removing metallic contaminants from said carbon slurry using a solubilization process. Thereafter, in a third processing step, said method entails filtering said carbon slurry to remove solubilized impurities. Thereafter, in a fourth processing step, said method entails increasing the pH level of the carbon slurry to obtain a colloidal system. In certain embodiments, the colloidal system can be homogeneous and/or stable. And thereafter, in a fifth processing step, said method entails further filtering said colloidal system to remove particles which fall above a predetermined volume threshold.

The present invention further provides a resistive material comprising a first volume of nanotubes and a second volume of nanoscopic particles in a predefined ratio relative to the first volume of nanotubes.

The present invention further provides a method for forming a composite article over a substrate is provided. The method can include depositing a first volume of nanotubes over said substrate to form a layer of nanotubes; and depositing a second volume of nanoscopic particles, in a predefined ratio relative to the first volume of nanotubes, on the layer of nanotubes. In certain embodiments, the second volume of nanoscopic particles can be deposited using ion implantation or vapor deposition.

In one aspect of the invention, a first volume of nanotubes is combined with a second volume of nanoscopic particles in a predefined ratio to obtain a mixture. The is can then be applied to a substrate via a spin coat process. The amount of said first volume of nanotubes and said second volume of nanoscopic particles (that is, the ratio of nanotubes to nanoscopic particles within the mixture) are selected such as to provide a desired volume density of nanotubes within the mixture. In this way, a composite article with a desired nanotube volume density can be realized.

In another aspect of the present invention, the nanotubes within the first volume of nanotubes are carbon nanotubes, such as single walled nanotubes.

In another aspect of the present invention, the second volume of nanoscopic particles includes nanoscopic particles which are other allotropes of carbon, including but not limited to, polyaromatic hydrocarbons, graphite, carbon nanopowder, amorphous carbon, carbon black, and diamond.

In another aspect of the present invention, the second volume of nanoscopic particles includes nanoscopic particles which are silicon based materials, including, but not limited to, silicon oxide ($SiO_2$) and silicon nitride ($Si_3N_4$).

In another aspect of the present invention, the second volume of nanoscopic particles includes nanoscopic particles which are multi-wall nanotubes (MWNTs).

In another aspect of the present invention, the nanotube volume density within the composite article is optimized to the needs of a given application or device.

Accordingly, it is the object of the present invention to provide an improved method for forming a composite article over a substrate.

It is also an object of the present invention that said method comprise combining a first volume of nanotubes with a second volume of nanoscopic particles in a predefined ratio such as to form a mixture which is well suited for use within a spin coat process.

It is further an object of the present invention that said method provide a method for applying a relatively thick composite article or film over a substrate within a minimum number of spin coat processes and preferably within a single spin coat process.

Other features and advantages of the present invention will become apparent from the following description of the invention which is provided below in relation to the accompanying drawings.

BRIEF DESCRIPTION OF THE DRAWINGS

FIG. 7 illustrates the improved switching behavior of the nonvolatile nanotube device of FIG. 6, in accordance with certain embodiments of the present invention.

DETAILED DESCRIPTION

Figure 1:
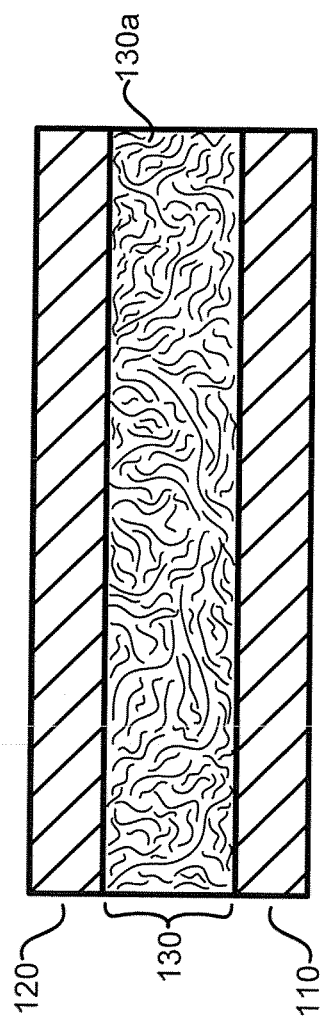
FIG. 1 illustrates a nanotube device comprising a composite article formed with only carbon nanotubes.

FIG. 1 illustrates a conventional nanotube device (e.g., a block switch) which makes use of a nanotube fabric layer comprising only carbon nanotubes. In a first operation, a carbon nanotube fabric layer 130 is deposited over a first electrode 110. The carbon nanotube fabric layer 130 is comprised of a volume of carbon nanotubes 130a formed into a cohesive fabric or film through the deposition process (e.g., spin coating, spray coating, or in situ growth). In a second operation, a second electrode 120 is deposited over the carbon nanotube fabric layer 130.

In a typical fabrication process, the thickness of the carbon nanotube fabric layer 130 is set above a certain threshold such as to prevent the second electrode 120 from becoming electrically connected (shorted) to the first electrode 110 (via the electrode material bleeding through the carbon nanotube layer 130, for example). As such, a nanotube fabric layer of significant thickness is often required.

Figure 2:
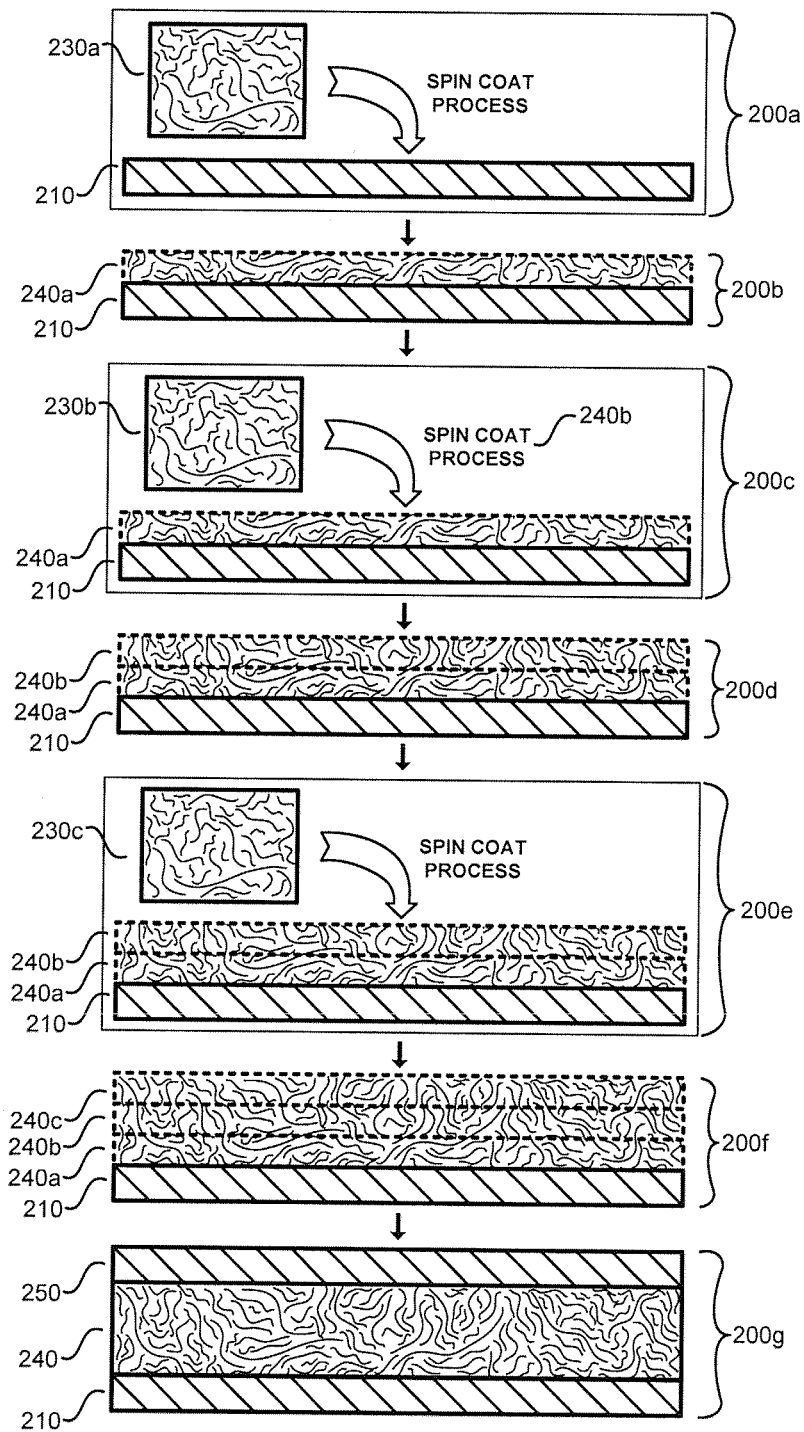
FIG. 2 illustrates a fabrication process suitable for fabricating the nanotube device depicted in FIG. 1.

FIG. 2 illustrates a conventional fabrication process suitable for realizing the nanotube block switch depicted in FIG. 1.

In a first operation 200a, a first volume of carbon nanotubes 230a is deposited over a first electrode element 210 via a spin coating process forming a first intermediate nanotube fabric layer 240a as illustrated by structure 200b.

In a second operation 200c, a second volume of carbon nanotubes 230b is deposited via a spin coating process over the first intermediate nanotube fabric layer 240a forming a second intermediate nanotube fabric layer 240b as illustrated by structure 200d.

In a third operation 200e, a third volume of carbon nanotubes is deposited via a spin coating process over the second intermediate nanotube fabric layer 240b forming a third intermediate nanotube fabric layer 240c as illustrated by structure 200f.

In this way, a nanotube fabric layer 240 (the combination of the first, second, and third intermediate nanotube layers 240a, 240b, and 240c) of a required thickness is formed over first electrode element 210. In a fourth operation, a second electrode element 250 is deposited over the nanotube fabric layer 240 as illustrated by structure 200g.

In its most basic form, certain embodiments of the present invention provide a resistive material that can be used within a plurality of different applications. Such applications include, but are not limited to, display elements, solar panels, and semiconductor circuits. For example, certain embodiments of the present invention include a plurality of nanotube based switching devices, including, but not limited to, block switches, programmable resistive materials, and programmable logic devices.

Furthermore, certain embodiments of the present invention provide resistive materials, including films and fabrics, with controlled and uniform nanotube densities, significantly reducing the cost and/or improving the performance of applications using such materials.

Figure 3:
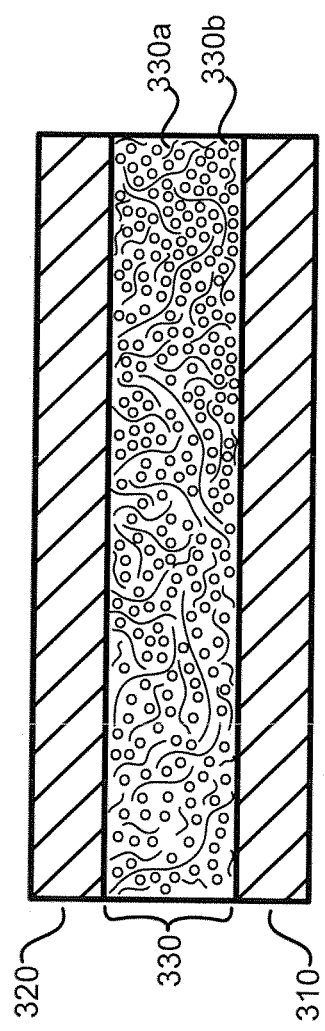
FIG. 3 illustrates a nanotube device comprising a composite article formed in accordance with certain embodiments of the present invention.

FIG. 3 illustrates one exemplary device, such as a nanotube block switch, in accordance with certain embodiments of the present invention. The device, such as the nanotube block switch shown, includes a composite article 330 containing a mixture of nanotubes 330a and nanoscopic particles 330b in a predefined ratio (said nanoscopic particles 330b depicted as circular elements within FIGS. 3 and 4 for clarity). It should be noted that although FIG. 3 depicts the nanoscopic particles 330b as the discrete phase and the nanotubes 330a as the matrix phase, the morphology of the nanoscopic particles 330b and nanotubes 330a may be different. For example, in certain embodiments, the nanotubes 330a may form the discrete phase and the nanoscopic particles 330b may form the matrix phase. In some other embodiments, the nanotubes 330a and the nanoscopic particles 330b can both form interconnected matrix phases. The composite article 330 can act as a switching material between a first electrode 310 and a second electrode 320. The fabrication, function, and use of nanotube block switches is discussed in greater detail within U.S. patent application Ser. No. 11/835,856 to Bertin et al., which is incorporated by reference herein in its entirety.

The nanoscopic particles are purposefully introduced in a predefined ratio with respect to the nanotubes to control the composition and, consequently, physical, electrical, and thermal aspects of the resulting composite articles. Whereas in other contexts, nanoscopic particles other than nanotubes might be viewed as undesirable impurities, in the composite article of the present invention, the nanoscopic particles are a deliberately added component, introduced to achieve the desired device performance, such as desired switching attributes. Indeed, the nanoscopic particles are selectively mixed with nanotubes to form a composite article having a predefined volumetric ratio of nanoscopic particles to nanotubes. The ratio may be pre-selected and tuned to ensure, for example, the desired range of electrical switching or resistive states. The attributes of the nanoscopic particles—the material, the size, the uniformity of the particulate population, the shape of the nanoscopic particles, its interaction with the nanotubes, etc.—can all be specifically selected to further tune the desired device characteristics (e.g., electrical switching or resistive characteristics) of the resultant composite article. Moreover, in certain instances, the attributes of the nanoscopic particles itself may further dictate the predefined ratio of the nanoscopic particles and nanotubes. Regardless, in each case, the purposeful and deliberate addition of nanoscopic particles can have the common effect of allowing inventors additional control in tuning and refining the characteristics (electrical, physical, thermal or otherwise) of the composite article. For example, addition of the nanoscopic particles in a predefined ratio with the nanotubes may decrease the switching voltages of the composite article as compared to switches formed from pristine nanotubes.

The predefined ratio of the nanoscopic particles to the nanotubes can be any ratio selected by the manufacturer depending on the application, method of combination, or the composition of materials used in the device. For example, in certain applications, some suitable and non-limiting predefined ratio of the nanoscopic particles to the nanotubes may be from about 1:1 (one part nanoscopic particles to about one part nanotubes) to about 1:10 (one part nanoscopic particles to about ten part nanotubes). For example, some suitable and non-limiting predefined ratio of the nanoscopic particles to the nanotubes may be 1:1, 1:2, 1:3, 1:4, 1:5, 1:6, 1:7, 1:8, 1:9, or 1:10.

The nanoscopic particles 330b can take a plurality of forms depending on the needs of an application or structure in which the methods of the present invention are employed. The nanoscopic particles may be spherical, oblong, square, irregular, or any other shapes as would be readily apparent to ordinary skill in the art. The nanoscopic particles may have at least one dimension that is in the nanometer size. For example, the nanoscopic particles may have at least one dimension which is less than 100 nm, 50 nm, 40 nm, 30 nm, 25 nm, 20 nm, 10 nm, 5 nm, or 1 nm. In certain embodiments, the nanoscopic particles may have dimensions that are acceptable in semiconductor fabrication facilities, such as a CMOS facility. In certain embodiments, the nanoscopic particles may be individual atoms or ions.

The nanoscopic particle can interact covalently or non-covalently to another nanoscopic material, for example, carbon nanotubes. In certain embodiments, the nanoscopic particles may be miscible with the nanotubes and form a continuous material around the nanotube. In some other embodiments, the nanoscopic particles may be inert to the nanotubes and remain in the same form as initially introduced into the mixture and therefore non-miscible. In yet some other embodiments, the nanoscopic particles may be partially miscible with the nanotubes and form a semi-miscible mixture with the nanotubes. In certain embodiments, the nanoscopic particles may have the ability to alter the porosity between the carbon nanotubes.

The nanscopic particles may be introduced to the composite article either before deposition on the substrate or after the nanotube is applied to the substrate. In the first application, the nanoscopic particles can be combined with the carbon nanotubes by introducing them into the solution containing carbon nanotubes then depositing the combined mixture onto the substrate. In the second application, the nanoscopic particles can be introduced, for example, by ion implantation, vapor deposition, sputtering, or other methods known in the art after first forming a nanotube layer on the substrate.

Furthermore, in certain embodiments, the choice of such nanoscopic particles can include a material or materials that can be formed with a uniform particle size. In certain applications, the choice of a nanoscopic particle can include a material or materials which can be fabricated as individual particles within certain dimensions. For example, an application may require a nanoscopic particle wherein individual particles are not larger than some fraction of a device feature size.

In some other embodiments, the choice of such nanoscopic particles can include a material or materials which do not adversely affect the switching operation (that is, the changing from one nominal nonvolatile resistive state to another) of the composite article. In fact, in certain embodiments, the nanoscopic particles 330b may improve switching operation by lowering the voltage needed for the composite article to change its resistance.

In some other embodiments, inorganic nanoparticles can be utilized. For example, silicon based materials (such as, but not limited to silicon oxide and silicon nitride) can be used for said nanoscopic particles 330b.

In some embodiments, one or more allotropes of carbon (such as, but not limited to, diamond, graphite, graphene, fullerenes, amorphous carbon, carbon black, carbon nanopowder, carbon nanobuds, carbon nanorods, carbon nanofoam, lonsdaleite, linear acetylenic carbon, polyaromatic hydrocarbons, and the like) can be used for said nanoscopic particles 330b.

In certain embodiments, nanoscopic particles 330b can include a mixture of different nanoscopic materials, such as any combination of nanoscopic particles 330b described above.

The nanoscopic particles 330b can be obtained by numerous different ways. For example, carbon particles having of particles of substantially uniform volume can be obtained through the process described below. Methods for obtaining other desired nanoscopic materials 330b will be readily apparent to one of ordinary skilled in the art.

In a first processing step, reacting a volume of carbon black material with an oxidizing agent (such as, but not limited to, nitric acid) to form a carbon slurry in order to decrease the size of carbon black particles and further remove any metallic contaminants (via solubilization). The first processing step may be aided by further introducing other acids, such as hydrochloric acid.

In next processing step, filtering the carbon slurry formed in the first process step at low pH (for example, but not limited to, via cross-flow membranes) to remove any solubilized impurities In a next processing step, increasing pH level of the carbon slurry to realize a homogeneous and stable colloidal system (in some operations, a sonication process may be used to improve homogeneity)

In a next processing step, filtering the realized homogeneous and stable colloidal system through a train of filters to remove any particles which could lead to defects in the spin coated film (in some operations, for example, said system would be passed through filters with pores as small as 10 nm or 5 nm or other filters with the smallest pore size available)

As described in greater detail below, the resulting colloidal system of processed carbon particles can then be combined with a carbon nanotube solution at a ratio which will enable the generation of a film or fabric layer which will comprise a desired volume density of carbon nanotubes.

Figure 4:
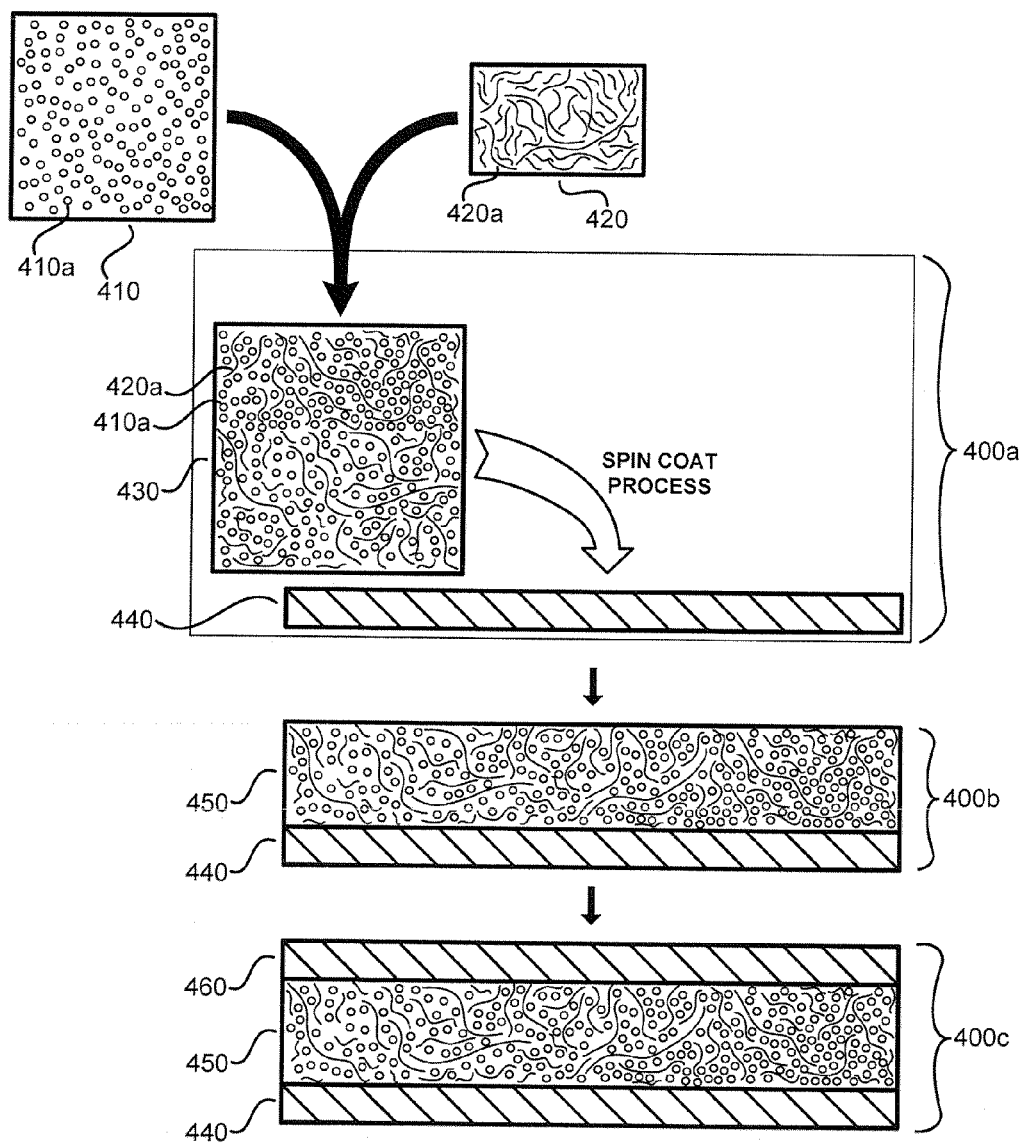
FIG. 4 illustrates a fabrication process for a nanotube device in accordance with certain embodiments of the present invention.

FIG. 4 illustrates a nanotube block switch fabrication process in accordance with certain embodiments of the present invention. A first volume 420 of nanotubes 420a is combined with a second volume 410 of nanoscopic particles 410a to obtain a mixture 430. The mixture 430 can be homogeneous or heterogeneous. One of ordinary skill in the art will readily appreciate the various different ways the mixture 430 can be formed.

In certain embodiments, mixture 430 can be formed so that the mixture 430 can be utilized in semiconductor fabrication facilities, such as in Class 100, 10, or 1 facilities (e.g., CMOS facilities). For example, the mixture 430 can be substantially free of undesirable particulate and metal impurities, such as being substantially free of particulate impurities that are greater than 1000 nm, 500 nm, 400 nm, or even 300 nm in diameter. As another example, the nanotubes 420a and nanoscopic particles 410a can be combined in a solvent that is acceptable for use in semiconductor facilities, such as an aqueous (e.g., highly purified water) or non-aqueous solvents that are compatible with semiconductor fabrication processes.

In process step 400a, the mixture 430 is deposited over a first electrode element 440 via a spin coating process to form composite article 450 (as illustrated by structure 400b). The mixture 430 allows for the deposition of significantly thicker (as compared to prior art nanotube solutions) layers (or films) within a single spin coat process as compared to nanotube-only liquids. For example, thickness ranging from about a few to hundreds of nanometers may be possible through a single coat. Some non-limiting example thicknesses that can be achieve include 1, 2, 2.5, 5, 10, 20, 30, 40, 50, 60, 70, 80, 90, 100, 150, or 200 nm. As such, a sufficiently thick composite article suitable for use within a plurality of nanotube block switching devices (such as, but not limited to, block switches, programmable resistive materials, and programmable logic devices) can be realized in a minimum number of spin coat process steps. Further, in many applications, such a layer can be realized within a single spin coat process step, significantly reducing process time and cost.

Then, a second electrode element 460 is deposited over the composite article 450 as illustrated by structure 400c.

Figure 5:
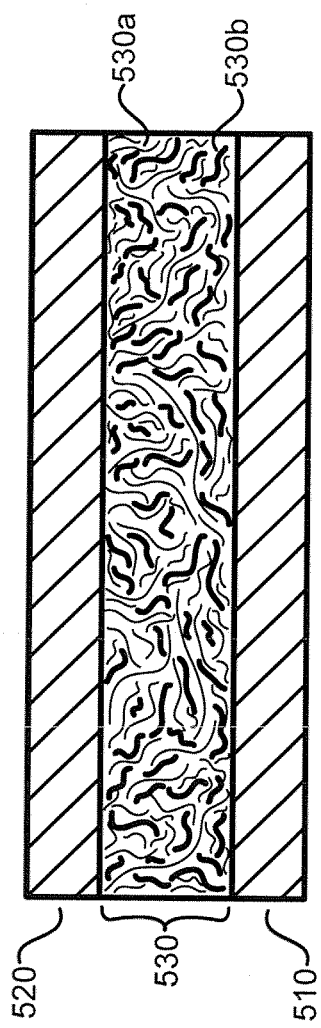
FIG. 5 illustrates a nanotube device in accordance with certain embodiments of the present invention wherein multiwall nanotubes (MWNTs) are used as nanoscopic particles.

FIG. 5 illustrates a nanotube block switch with a composite article 530 formed via an alternate embodiment of the methods of the present invention. A first volume of single wall nanotubes (SWNTs) 530a can be combined with a second volume of multi-wall nanotubes (MWNTs) 530b to form a mixture. In certain embodiments, said second volume of MWNTs 530b can act as the nanoscopic particles while said first volume of SWNTs 530a are single walled carbon nanotubes.

Then, said mixture can be deposited over a first electrode 510 via a spin coating process to form composite article 530. The composite article 530 can have very low level metal contamination. For example, the composite article 530 may have less than $10^{18}$, $10^{16}$, $10^{15}$, $10^{14}$, $10^{13}$, $10^{12}$, $5 \times 10^{11}$, $1 \times 10^{11}$, $5 \times 10^{10}$, or even less than $1 \times 10^{10}$ atoms/cm$^2$. Thereafter, a second electrode 520 can be deposited over the composite article 530.

It should be noted that while FIGS. 4 and 5 depict two exemplary fabrication process in order to clearly illustrate the methods of the present invention, said methods are not limited to these exemplary embodiments. Rather, one of ordinary skill in the art would readily recognize other methods for forming the desired nanotube devices. For example, the methods of the present invention are well suited to forming a relatively thick carbon nanotube films. However, the present invention is not limited in this regard. Indeed, the methods of the present invention are applicable to a plurality of applications wherein a specific volume density of carbon nanotubes is required within a carbon nanotube film, including, but not limited to, those applications employing very thin films. Accordingly, one of ordinary skill in the art would readily recognize the various different embodiments for fabrication the desired nanotube devices of interest.

Example

Figure 6:
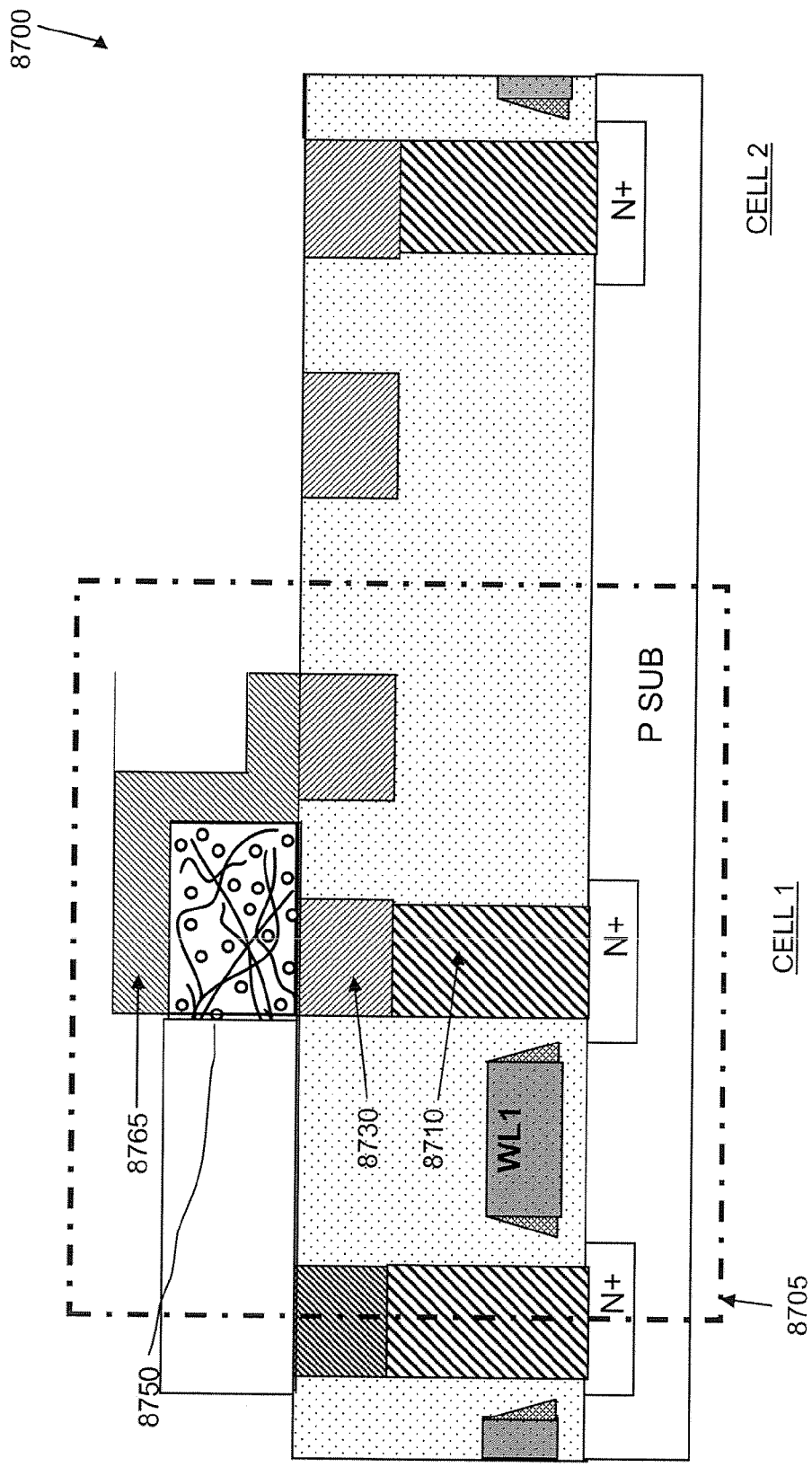
FIG. 6 illustrates a nonvolatile nanotube device in accordance with certain embodiments of the present invention.

FIG. 6 depicts a nonvolatile nanotube switch. As shown, cell structure 8700 having cell 8705 comprises a composite article 8710 containing nanotubes and nanoscopic particles. The nanoscopic particles can include carbon particles having substantially uniform volume as described above. The composite article 8750 has top/end contact 8765 and bottom 8730 contact. The present cell select and control structure includes conductive plug 8710 connecting bottom contact 8730 to an N+ region embedded in P-type substrate PSUB. In the present cross sectional view word line WL1 is used as one portion of the cell select circuitry. Cell 8705 may be integrated on a 1024 bit array for the purposes of electrical testing to evaluate electrical characteristics of the composite article 8750. In one or more embodiments, tests include SET to program the cell (write 1), RESET to erase the cell (write 0) and READ to access the stored state of the cell. SET, RESET and READ functions are known in the art and discussed in greater detail above in relation to 3-D cell structures employing nanotube articles.

FIG. 7 summarizes typical RESET and SET electrical parameters, according to one or more embodiments. Specifically, typical applied pulse rise and fall times, duration, voltages and currents are listed. Testing has revealed that in certain embodiments and switch structures, the composite article 8710 containing nanotubes and nanoscopic particles enables a lower operating voltage than does the CNT-only material counterpart. For example, various embodiments of the nonvolatile nanotube switch functions at operating voltages less than or equal to approximately 5.0V. As a point of comparison, various switching structures having CNT-only materials to form the carbon nanotube articles typically function at operating voltages between approximately 7.0 and 8.0V. Moreover, testing has suggested that the composite article 8710 containing nanotubes and nanoscopic particles, when used in certain switch configurations, may be faster in performing the SET function than a CNT-only material counterpart. In other words, the composite article 8710 containing nanotubes and nanoscopic particles may, in certain embodiments, be programmable under shorter duration write 1 operations.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A method for forming a composite nanofabric article over a substrate, said method comprising:
   combining a first volume of nanotubes with a second volume of nanoscopic particles at a predefined ratio relative to said first volume of nanotubes to form a mixture; and
   depositing said mixture over said substrate to form the composite nanofabric article;
   wherein said second volume of nanoscopic particles includes at least one of silicon nitride particles and multi-walled nanotubes.

2. The method of claim 1, wherein the nanotubes comprising said first volume are substantially all carbon nanotubes.

3. The method of claim 1 wherein said second volume of nanoscopic particles includes nanoscopic particles containing at least one allotrope of carbon.

4. The method of claim 1, wherein said second volume of nanoscopic particles includes silicon oxide particles.

5. The method of claim 1, wherein substantially all of said nanoscopic particles within said second volume fall within a predetermined volume tolerance.

6. The method of claim 1, wherein at least one of the magnitude of said first volume of nanotubes and the magnitude of said second volume of nanoscopic particles is selected to realize a desired volume density of nanotubes within said composite article.

7. The method of claim 1, wherein the mixture is a homogeneous mixture.

8. The method of claim 1, wherein the mixture is a heterogeneous mixture.

9. The method of claim 1, wherein the composite nanofabric article has less than about $10^{11}$ metal atoms/cm.

10. The method of claim 1, wherein said depositing said mixture over said substrate is performed via a spin coat process.

11. A method of forming substantially uniform nanoscopic particles of carbon particles from a volume of carbon black material, said method comprising:
    reacting said volume of carbon black material with an oxidizing agent to form a carbon slurry;
    removing metallic contaminants from said carbon slurry by solubilizing said metallic contaminants;
    filtering said carbon slurry to remove the solubilized metallic contaminants; increasing a pH level of the carbon slurry to obtain a colloidal system; and
    filtering said colloidal system to obtain carbon particles which fall above a predetermined volume threshold; wherein said carbon particles contain one or more carbon allotropes.

12. The method of claim 11, wherein said colloidal system is a homogeneous and stable colloidal system.

13. The method of claim 11, wherein said colloidal system is a heterogeneous and stable colloidal system.

14. The method of claim 11, wherein said oxidizing agent comprises nitric acid.

15. The method of claim 14, wherein said increasing the pH level of the carbon slurry includes a sonication process.

16. A method for forming a switching device, said method comprising:
    depositing a first electrode over a substrate,
    depositing a first volume of nanotubes over said first electrode to form a layer of nanotubes,
    depositing a second volume of nanoscopic particles, at a predefined ratio relative to said first volume of nanotubes, on said layer of nanotubes to form said composite article, and
    depositing a second electrode over said composite article to form the switching device.

17. The method of claim 16, wherein said second volume of nanoscopic particles is deposited using ion implantation.

18. The method of claim 16, wherein said second volume of nanoscopic particles is deposited using vapor deposition.

19. The method of claim 16, wherein said second volume of nanoscopic particles is deposited using sputtering.

20. The method of claim 16, wherein said depositing a first volume of nanotubes is performed by spin coating.

* * * * *